(12) United States Patent
Ohto et al.

(10) Patent No.: US 7,531,891 B2
(45) Date of Patent: May 12, 2009

(54) SEMICONDUCTOR DEVICE

(75) Inventors: Koichi Ohto, Kawasaki (JP); Tatsuya Usami, Kawasaki (JP); Yoichi Sasaki, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 509 days.

(21) Appl. No.: 11/006,529

(22) Filed: Dec. 8, 2004

(65) Prior Publication Data
US 2005/0167844 A1 Aug. 4, 2005

(30) Foreign Application Priority Data
Feb. 3, 2004 (JP) .............................. 2004-027158

(51) Int. Cl.
*H01L 23/58* (2006.01)
*H01L 29/00* (2006.01)
*H01L 21/31* (2006.01)

(52) U.S. Cl. ........................ 257/634; 257/635; 257/650; 257/655; 257/E21.277; 438/758; 438/787; 438/789; 438/931

(58) Field of Classification Search .................. 257/649, 257/760, E23.167, E21.275, 634, 635, 650, 257/655, E21.277; 438/624, 778, 783, 758, 438/787, 789, 931, 757
See application file for complete search history.

(56) References Cited

U.S. PATENT DOCUMENTS

| | | | | |
|---|---|---|---|---|
| 5,347,100 A | * | 9/1994 | Fukuda et al. ............... | 257/760 |
| 5,598,027 A | * | 1/1997 | Matsuura .................... | 257/635 |
| 5,716,890 A | * | 2/1998 | Yao ............................. | 438/624 |
| 5,939,788 A | * | 8/1999 | McTeer ....................... | 257/751 |
| 6,001,747 A | * | 12/1999 | Annapragada ............... | 438/790 |
| 6,232,663 B1 | * | 5/2001 | Taniguchi et al. ........... | 257/758 |
| 6,458,657 B1 | * | 10/2002 | Chang ......................... | 438/257 |
| 6,506,690 B1 | * | 1/2003 | Lobbins ...................... | 438/783 |
| 6,593,247 B1 | * | 7/2003 | Huang et al. ................ | 438/758 |

(Continued)

FOREIGN PATENT DOCUMENTS

JP    2001-326222    11/2001

OTHER PUBLICATIONS

M. Tagami et al., "Effects Of Stress Control Layer(SCL) on Via-Stability in Organic Low-K?CuDual damascene Interconnects under Thermal Cycle Stress" Interconnect technology Conference, 2003 Proceedings Of The IEE 2003 International Jun. 2-4, 2003, pp. 213-215.*

(Continued)

*Primary Examiner*—Long Pham
*Assistant Examiner*—Steven H Rao
(74) *Attorney, Agent, or Firm*—Young & Thompson

(57) ABSTRACT

A semiconductor device having improved adhesiveness between films composing an interlayer insulating film is presented by providing multilayered films in the interlayer insulating films having film density distribution, in which the film density is gradually changes. A SiOC film is deposited to a thickness of 300 nm via a plasma CVD process, in which a flow rate of trimethylsilane gas is stepwise increased. In this case, the film density of the deposited SiOC film is gradually decreased by stepwise increasing the flow rate of trimethylsilane gas. Since trimethylsilane contains methyl group, trimethylsilane has more bulky molecular structure in comparison with monosilane or the like. Thus, the film density is decreased by increasing the amount of trimethylsilane in the reactant gas.

13 Claims, 11 Drawing Sheets

U.S. PATENT DOCUMENTS

| | | | |
|---|---|---|---|
| 6,737,746 B2 * | 5/2004 | Matsuura | 257/759 |
| 6,747,355 B2 * | 6/2004 | Abiru et al. | 257/758 |
| 6,815,824 B2 * | 11/2004 | Shioya et al. | 257/760 |
| 6,838,772 B2 * | 1/2005 | Saitoh et al. | 257/758 |
| 6,844,612 B1 * | 1/2005 | Tian et al. | 257/634 |
| 2003/0017698 A1 * | 1/2003 | Ikeda | 438/687 |
| 2006/0038297 A1 * | 2/2006 | Usami et al. | 257/758 |

OTHER PUBLICATIONS

N. Oda et al. "A Robust Embedded Ladder-oxide/Cu Multilevel Interconnect Technology for ).13um CMOS generation" 2002 Symposium on VLSI Technology, Digest Of Technical Papers Jun. 11-13, 2002 pages 34-35.*

K. Ueno et al., "A high Reliability Coper Dual-Damascene Interconnection with Direct-Contact via structure", Electron devices meeting, 2000, IEDM Technicial Digest, Inter, Dec. 10-13, 200 pp. 265-268.*

Zhe Chen et al., "Highly reliable dieelctric/metal barrier sidewall bilayer diffusion barrier in Cu/porous organic ultralow-K interconnects" Reliability Physics Symposium Proceedings, 2004, 42 nd Annual 2004 IEEE International, Apr. 25 to 29, 2004 pp. 320-325.*

Lee A.S., "Reliability Of Dielectric barriers in copper damascene applications" Integrated Reliability Workshop Final Report, 2003 IEEE International, Oct. 20-23, 2003 pp. 137-138.*

Ken-Ichii Takeda et al., "Copper-induced Dielectric breakdown in silicon oxide deposited by plasma-enhanced chemical vapor deposition using trimethxysilane" Journal Of applied PHYsics, vol. 94, No. 4, pp. 2572-2578.*

K. Maex et. al., "Low dielectric constant material for microelectronics" Journal Of Applied Physics, vol. 93 No. 11, (Jun. 2003) pp. 8793-8841.*

Hartfiedl C.D et al. "Interface reliability assessmnts for Copper/low-K products", Devic and Materials Reliability, IEEE Transactions, Jun. 2004, vol. 4 Issue 2 pp. 129-141.*

Ogawa E.T. et al., " Leakage, breakdown and TDDB characteristics of porous low-K Silica-based interconnect dielectrics", Reliability Physics Symposium Proceedings, 2003, 41 Annual, 2003 IEEE International, Mar. 30-Apr. 4, 2003, pp. 166-172.*

Tada M. et al., Improvemetnof TDDB reliability in Cu damascene interconnect by using united hard-mask and Cap(UHC) structure, Interconnect Technology Conference, 2003, Proceedings of the IEE 2003 International, Jun. 2-4, 2003, pp. 256-258.*

* cited by examiner

FIG. 7A
| DEPOSITION STEPS | 1 | 2 | 3 | 4 | 5 |
|---|---|---|---|---|---|
| | Stab. | 1st | 2nd | main | pump |
| TEMPERATURE (°C) | 350 | 350 | 350 | 350 | 350 |
| PRESSURE (Torr) | 4 | 4 | 4 | 4 | 4 |
| RF power (W) | 600 | 600 | 600 | 600 | 600 |
| TRIMETHYLSILANE (3MS) GAS FLOW RATE (sccm) | 100 | 100 | 500 | 1000 | 0 |
| $O_2$ (sccm) | 500 | 500 | 500 | 500 | 0 |
| He (sccm) | 300 | 300 | 300 | 300 | 0 |
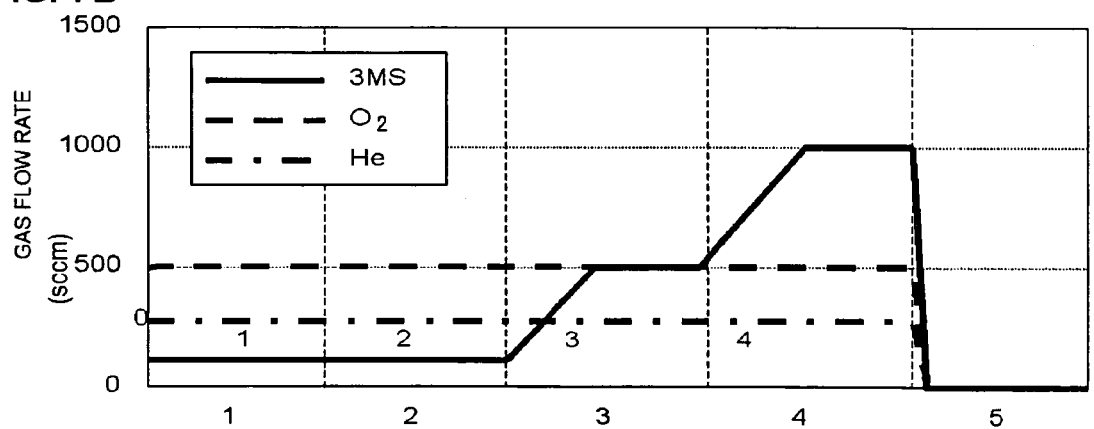
FIG. 7B
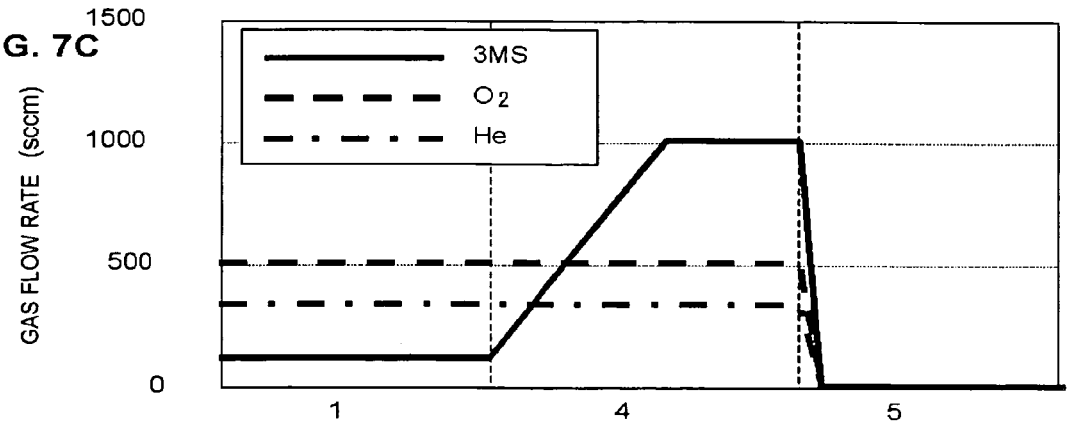
FIG. 7C

|  | SiOCH SEQUENTIAL DEPOSITION STEPS | | |
|---|---|---|---|
|  | ini. 1st | ini 2nd | main |
| DENSITY (g/cm$^3$) | 2.08 | 1.50 | 1.33 |
| ELASTIC MODULUS (GPa) | 60.16 | 15.80 | 9.65 |
| m-ELT (MPa·m-1/2) | NO PEELING OFF | NO PEELING OFF | 0.17 |

| MONOLAYER FILM | CONTINUOUS FILM |
|---|---|
| 45% | 100% |

| DEPOSITION STEPS | 1 | 2 | 3 | 4 | 5 | 6 | 7 |
|---|---|---|---|---|---|---|---|
| | Stab. | 1st | 2nd | main | 4th | 5th | pump |
| TEMPERATURE (°C) | 350 | 350 | 350 | 350 | 350 | 350 | 350 |
| PRESSURE (Torr) | 4 | 4 | 4 | 4 | 4 | 4 | 4 |
| RF power (W) | 600 | 600 | 600 | 600 | 600 | 600 | 600 |
| TRIMETHYLSILANE (3MS) GAS FLOW RATE (sccm) | 100 | 100 | 500 | 1000 | 500 | 100 | 0 |
| O$_2$ (sccm) | 500 | 500 | 500 | 500 | 500 | 500 | 0 |
| He (sccm) | 300 | 300 | 300 | 300 | 300 | 300 | 0 |

SEMICONDUCTOR DEVICE

This application is based on Japanese Patent Application NO. 2004-027158, the content of which is incorporated hereinto by reference.

BACKGROUND OF THE INVENTION

1. Field of the Invention

The present invention relates to a semiconductor device having an improved interlayer adhesiveness in an interlayer insulating film.

2. Related Art

Needs for achieving faster operation of semiconductor devices are growing in recent years, and in order to meet the needs, technologies for providing a metal interconnect with copper to reduce the interconnect resistance are widely employed. Such interconnect structure is formed via a damascene process including a chemical mechanical polishing (CMP) process.

When a damascene copper interconnect is formed, it is essential to provide an etch stopper film for forming an interconnect trench and/or a through hole, or a protective film for inhibiting the damage to the interlayer insulating film occurred during the chemical mechanical polishing (CMP) process. However, when such etch blocking film and/or protective film is employed, sufficient adhesiveness with other insulating films may not be obtained, and thus there is a room for the improvement.

Such problem concerning the adhesiveness becomes to be particularly considerable when an insulating material having lower dielectric constant is employed as a material for the interlayer insulating film. In most recent days, an investigation for reducing a capacitance among the interconnects is actively conducted, by replacing the material for the interlayer insulating film from the conventional silicon oxide film (dielectric constant K is approximately 4.3) to a low dielectric constant material having a dielectric constant of equal to or lower than 3.0. Although the use of such low dielectric constant insulating material for the interlayer insulating film reduces the crosstalk between the interconnects to allow achieving faster operation of the device, insufficient adhesiveness with the etch stopper film and/or the protective film may be presented. The problem concerning the adhesiveness becomes considerable when a SiOC film formed via a chemical vapor deposition (CVD) (hereinafter referred to as "CVD-SiOC film") or a porous film is employed.

Investigations for improving the adhesiveness of the interlayer insulating film are conducted in various ways. For example, the assignee of the present application discloses in Japanese Patent Laid-Open No. JP-A-2001-326,222 that a technology for improving the adhesiveness by suitably selecting the material for the films is proposed.

SUMMARY OF THE INVENTION

In view of the above situation, the present invention provides a solution to the above-mentioned problems, and the present invention provides a technology to improve the interlayer adhesiveness of the interlayer insulating film layer.

Conventionally, a technique for improving the adhesiveness at an interface of films of different types, which has been investigated, is to design a preferable component of the films by suitably selecting the materials of the films. However, this technique does not necessarily easily provide the higher level of the adhesiveness that is expected in recent years. The inventors of the present invention has considered that a thermal stress is remained at the interface of the films by a thermal history undertaken in the semiconductor manufacturing process, and the thermal stress induces the decrease of the adhesiveness, and on the basis of the consideration, a solution to the above-described problem is achieved. As a result of eagerly conducting the investigations in view of the aforementioned consideration, the inventors of the present invention have found that suitable design of the interlayer insulating film by focusing an attention to the film density is effective for improving the adhesiveness at the interface, and thus the present invention is made on the basis of such finding.

According to the present invention for solving the above-described problems, there is provided a semiconductor device, comprising: a semiconductor substrate; and an interlayer insulating film on the semiconductor substrate, wherein the interlayer insulating film includes a multilayered film having a first insulating film and a second insulating film having lower film density than the first insulating film, and wherein the second insulating film includes a first density transition region, the first density transition region having a film density distribution profile in which the film density gradually decreases as a distance from the first insulating film increases.

The semiconductor device according to the present invention has a configuration, which comprises the first density transition region having the film density distribution profile, in which the film density gradually decreases as a distance from the first insulating film increases. Thus, the interlayer insulating film having improved adhesiveness of the interior of the multilayered film can be presented, while providing a lower dielectric constant. As above-described, having such a film density distribution, in which the film density gradually decreases as the distance increases from the first insulating film, stress generated at the interface between the first insulating film and the second insulating film is gradually relaxed, thereby considerably improving the adhesiveness therebetween. This improvement, in turn, provides improved thermal cycle resistance, and thus the semiconductor device having higher reliability can be achieved. Although a specific limitation is laid on the design of the dielectric constant of the second insulating film in the side having the first insulating film provided thereon, due to the presence of the density transition region having above-described configuration, the dielectric constant of the whole second insulating film can be reduced, since the dielectric constant of the other region thereof can be arbitrarily selected to a lower value.

According to the present invention, since the device has multilayered film having a film density distribution, in which the film density gradually decreases in the interlayer insulating films, the adhesiveness between films that composes the interlayer insulating film can be improved.

BRIEF DESCRIPTION OF THE DRAWINGS

The above and other objects, advantages and features of the present invention will be more apparent from the following description taken in conjunction with the accompanying drawings, in which:

FIG. 7A is a table, describing conditions for the depositing process employed in embodiments, and FIGS. 7B and 7C are graphs, showing changes in gas volumetric flow rates over time;

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments adopting the present invention to damascene copper interconnect structure will be described as follows in reference with the annexed figures. In all figures, identical numeral is assigned to similar element, and the detailed description thereof is appropriately omitted.

FIRST EMBODIMENT

Figure 1:
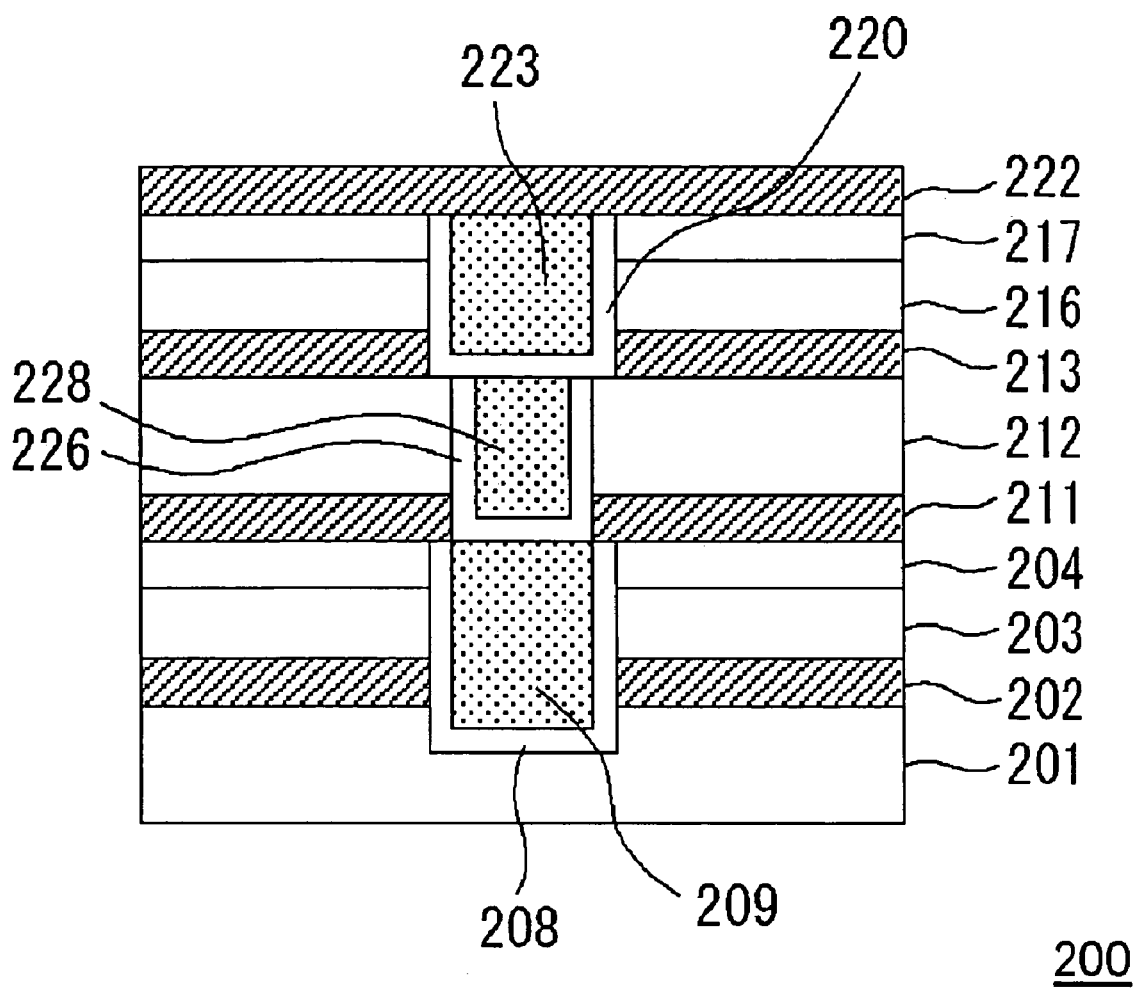
FIG. 1 is a cross-sectional view of a semiconductor device, showing a copper interconnect structure according to an embodiment.

FIG. 1 is a cross-sectional view, showing a structure of a semiconductor device 200 according to the present embodiment. The semiconductor device 200 according to the present embodiment has a structure, in which an interlayer insulating film is formed on a silicon substrate, and a multilayered interconnect structure comprising copper interconnects and vias is provided within the interlayer insulating film. The illustrated structure is an example showing a portion of such multilayered interconnect structure, and the structure has a configuration, in which a lower layer interconnect consisting of a Cu film 209 is coupled to an upper layer interconnect consisting of a Cu film 223 via a copper plug 228.

The lower layer interconnect consisting of the Cu film 209 is formed within a multilayered film comprising an underlying insulating film 201, a SiCN film 202 that is a first insulating film, a SiOC film 203 that is the second insulating film and a SiO$_2$ film 204 that is a third insulating film. The first insulating film is, for example, an etch stopper film or a protective film, and the second insulating film is, for example, an insulating film embedded between the interconnects or vias. Side surfaces and a bottom surface of the Cu film 209 are coated with Ta/TaN films 208. (comprising Ta and TaN, deposited in the side of the Cu film 209 in this sequence, and so forth)

The copper plug 228 is provided in a via hole, which is formed in a multilayered film composed of a SiCN film 211 and a SiO$_2$ film 212, and the side surfaces and the bottom surface thereof are coated with Ta/TaN films 226.

The upper layer interconnect consisting of the Cu film 223 is formed on the multilayered film consisting of a SiCN film 213, a SiOC film 216 and a SiO$_2$ film 217. Side surfaces and a bottom surface of the Cu film 223 are coated with a Ta/TaN film 220. A SiCN film 222 is provided on the top of the Cu film 223.

In FIG. 1, the SiCN film 202, the SiCN film 211 and the SiCN film 213 are etch stopper films useful in forming the interconnects trenches, the via holes or the like by a dry etching. The SiO$_2$ film 204 and the SiO$_2$ film 217 are protective films useful in polishing copper films via chemical mechanical polishing (CMP) in the damascene process. Here, the "SiOC film" is a film formed via chemical vapor deposition (CVD) and includes silicon, oxygen, carbon and hydrogen as essential elements (CVD-SiOC film), and may also be referred to as "SiOCH film". In addition, the "SiCN film" is a film formed via CVD and includes silicon, carbon, nitrogen and hydrogen as essential elements, and may also be referred to as "SiCNH film".

In FIG. 1, the multilayered film consisting of the SiCN film 202 and the SiOC film 203 has a structure, in which the SiCN film 202 as the etch stopper film and the SiOC film 203 having lower film density than the SiCN film 202 are laminated. The SiOC film 203 contacts the SiCN film 202, and has a profile of the film density distribution, in which the film density gradually decreases as being further from the contacting surface with the SiCN film 202 that is defined as an origin. (i.e., decreases along the direction toward the upper laminating direction) In other words, the film density of the SiOC film 203 is relatively higher at the surface contacting with the SiCN film 202 and relatively lower in the upper portion in the laminating direction. Alternatively, the film density distribution of the SiOC film 203 may have other profile, which includes a portion having slightly increased film density as long as not providing a considerable influence to the whole film density of the SiOC film 203, in place of the above-described profile of the present embodiment, in which the film density is flatly decreases. In this case, the SiOC film 203 composes a monolayer film containing no composition-discontinuing surface. Here, "containing no composition-discontinuing surface" means a condition, in which no interface is created within the SiOC film 203, and having such configuration, a stable adhesiveness is obtainable in the SiOC film 203. As a result of having such film density distribution profile, distributions of the elastic modulus and the hardness within the film also have profiles, in which they gradually decrease as being further from the contacting surface with the SiCN film 202 that is defined as an origin. Here, the level of the film density can be confirmed by an observation with, for example, a scanning electron microscope. (SEM) The level of the density can be confirmed by observing cross section of the sample with SEM and finding the concentration difference in the obtained SEM image (secondary electron image). In addition, the film stress distribution has a profile, in which the film stress gradually increases as being further from the contacting surface with the SiCN film 202 that is defined as an origin. In other words, the film stress is in a value of the compression mode that is closer to the film stress of the SiCN film 202 in vicinity of the above-described contact surface, and the distribution thereof is that the stress in the tensile mode increases as being further from the SiCN film 202.

Here, the elastic modulus is a Young's modulus, and the hardness is a Vickers hardness. In addition, the film stress means a value that is observed when a monolayer film is formed on the silicon substrate.

Since the semiconductor device 200 according to the present embodiment is provided with the multilayered film having the above-described configuration, the thermal stress generated at the interface between the SiCN film 202 and the SiOC film 203 is gradually relaxed, thereby considerably improving the adhesiveness therebetween. Having this configuration, thermal cycle resistance or the like is improved, and thus higher reliability of the semiconductor device 200 can be achieved.

Focusing on a profile of the dielectric constant distribution of the SiOC film 203, lower dielectric constant is presented in the center, and higher dielectric constant is presented in vicinity of the SiCN film 202. Therefore, the lower dielectric constant of, for example, equal to or less than 3.0 is presented for the whole SiOC film 203, and thus the interlayer insulating film having a combination of the improved interlayer adhesiveness and the lower dielectric constant can be achieved.

As described above, SiOC film 203 having such profile of the film density distribution can be formed by changing the conditions of the deposition gas during the CVD process. More specifically, the flow rate of trimethylsilane (TMS) as a carbon source is set to be lower in vicinity of the SiCN film 202, and the flow rate thereof is set to be gradually increased, and the other conditions are appropriately set to provide the film having above-described configuration. Since trimethylsilane contains methyl group, trimethylsilane has more bulky molecular structure in comparison with monosilane or the like. Thus, the film density is decreased by increasing the amount of trimethylsilane in the reactant gas. Details of the manufacturing process will be described later.

While the configuration of the SiOC film 203 has been described, similar configuration may also be applied to the SiOC film 216. More specifically, the SiOC film 216 may have a profile of the film density distribution, in which the film density gradually decreases as being further from the SiCN film 213.

Although the present embodiment is described in reference with the configuration, in which the film density of SiOC film 203 is continuously and flatly decreased as being further from the SiCN film 202, an alternative configuration including a region having a constant film density may also be employed. The point is that it is enough to present a film density distribution, which promotes a relaxation of the thermal stress between the SiOC film 203 and the SiCN film 202. When the configuration as described in the present embodiment, in which the film density is sequentially changed, is employed, stress in the film is more preferably dispersed, and considerable improvement in the adhesiveness can stably obtained.

While the density transition region having the above-described film density distribution is provided over the entire SiOC film 203 in the present embodiment, the density transition region may be provided only in a portion of the SiOC film 203. In such case, desired profile of the film density distribution in the upper portion of the density transition region can arbitrarily be provided, and in view of reducing the dielectric constant, the film having a specific dielectric constant of, for example, equal to or less than 2.7, can be presented in the case of being composed of a porous film.

The film density distribution profile in the above-described density transition region may preferably have a feature, in which the film density thereof in vicinity of the SiCN film 202 is substantially equal to the film density of the SiCN film 202. Having such configuration, the adhesiveness between the SiCN film 202 and the SiOC film 203 can considerably be improved.

Such density transition region may be provided in the SiO$_2$ film 204 side of the SiOC film 203, in addition to the SiCN film 202 side of the SiOC film 203. In other words, the film density distribution, in which the film density progressively decreases as being further from the SiO$_2$ film 204, may be provided. Having this configuration, the adhesiveness thereof in the side of the SiO$_2$ film 204 is also improved, in addition to that of the side of the SiCN film 202.

Further, both of the density transition regions of the SiOC film 203 disposed either in the SiCN film 202 side and the SiO$_2$ film 204 side of the SiOC film 203 may have configurations, which are formed of multilayered films comprising films having different densities. Having such configuration, stable adhesiveness in the SiOC film 203 is obtained by a simple process.

Although the present embodiment is described by illustrating the case of employing the SiCN film for the first insulating film, other suitable films such as, for example, SiC film, SiN film, SiO$_2$ films and the like can be employed. In addition, while the present embodiment is described by illustrating the case of employing the SiOC film for the second insulating film, other suitable films containing suitable materials such as: films coated with suitable materials containing carbon, such as, for example, methyl silsesquioxane (MSQ), methylated hydrosilsesquioxanes (MHSQ) and the like; CVD film such as silicon carbide (SiC) and the like consisting essentially of silicon and carbon; or porosified films thereof, may also be employed.

Figure 2:
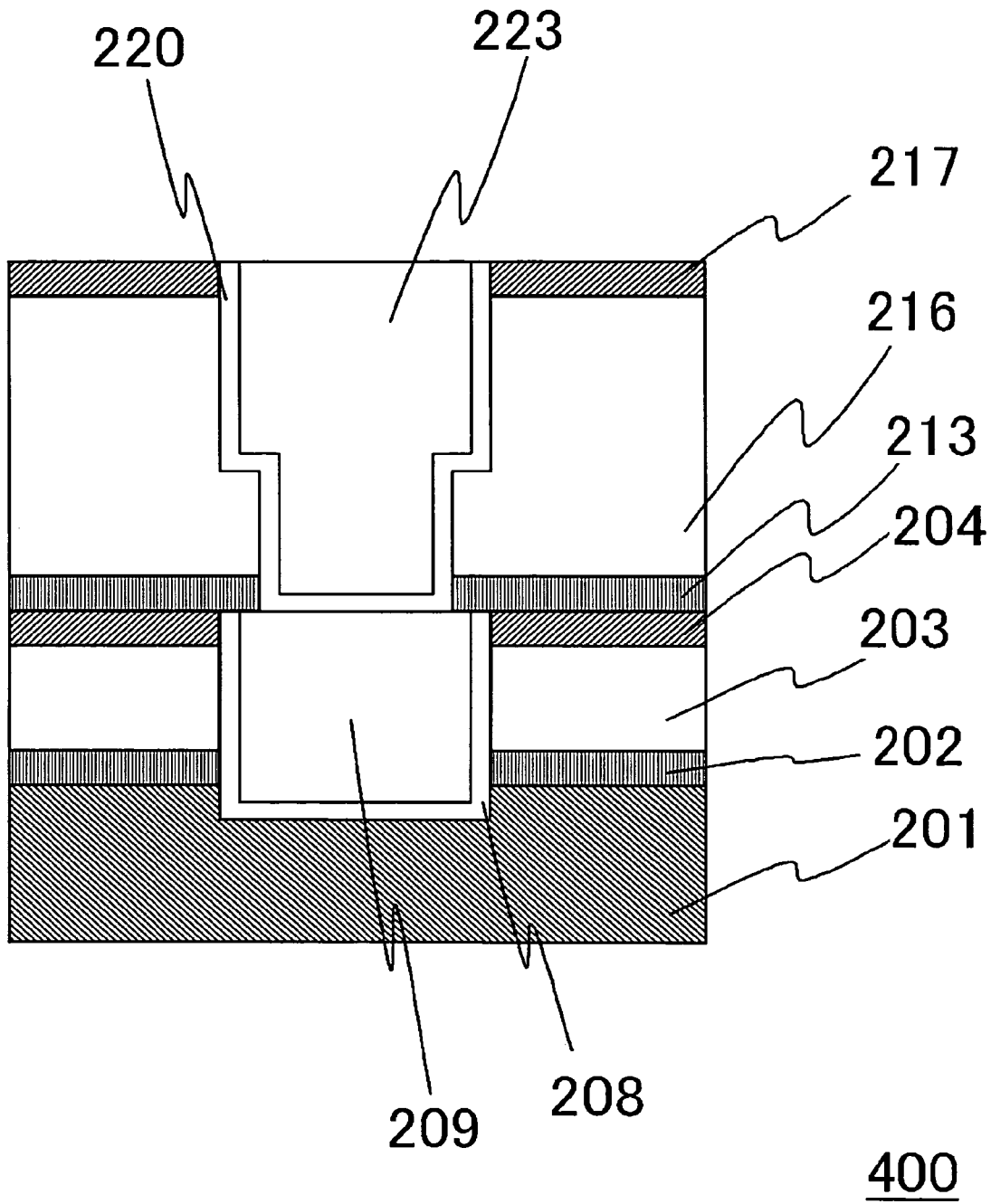
FIG. 2 is a cross-sectional view of a semiconductor device, showing a copper interconnect structure according to an embodiment.

In addition, while the present embodiment is described by illustrating the case of applying the present invention to the single damascene structure, the present invention may also be applied to the dual damascene structure. In this case, desired film density distribution can be obtained by forming the SiOC film 203 and the SiOC film 216 of the structure 400 shown in FIG. 2 via the process described in the present embodiment, in which the condition of the deposition gas is changed during the CVD process, and thus the interlayer insulating film having a combination of the improved interlayer adhesiveness and the lower dielectric constant can be achieved.

SECOND EMBODIMENT

Figure 3:
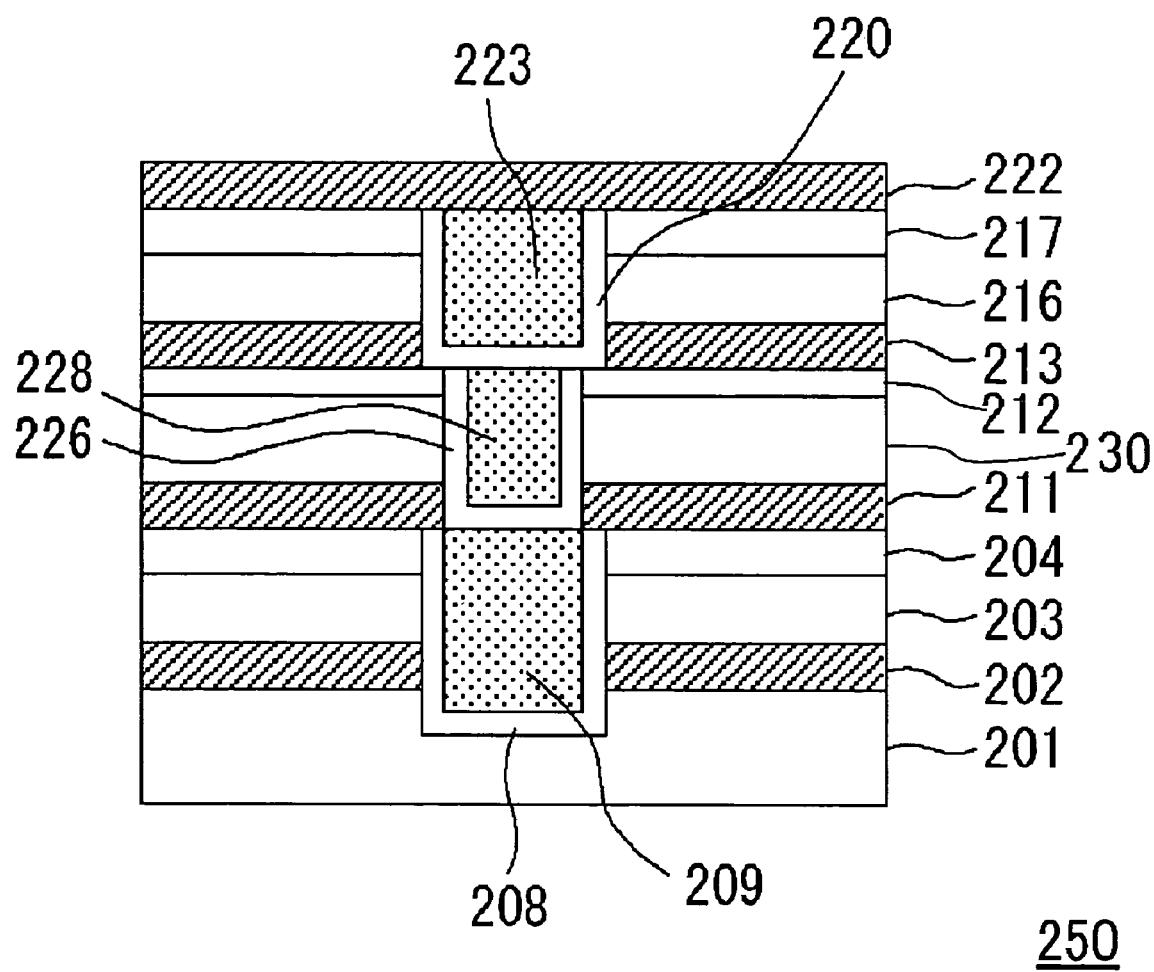
FIG. 3 is a cross-sectional view of a semiconductor device, showing a copper interconnect structure according to an embodiment.

FIG. 3 is a cross-sectional view, showing a structure of a semiconductor device 250 according to the present embodiment. The semiconductor device 250 according to the present embodiment has a structure, in which an interlayer insulating film is formed on a silicon substrate, and a multilayered interconnect structure comprising copper interconnects and vias is provided within the interlayer insulating film. The illustrated structure is an example showing a portion of such multilayered interconnect structure, and the structure has a configuration, in which a lower layer interconnect consisting of a Cu film 209 is coupled to an upper layer interconnect consisting of a Cu film 223 via a copper plug 228.

The copper plug 228 is provided in a via hole, which is formed in a multilayered film composed of a SiCN film 211 that is a first insulating film, a SiOC film 230 that is the second insulating film and a SiO$_2$ film 212 that is a third insulating film, and the side surfaces and the bottom surface thereof are coated with Ta/TaN films 226.

In FIG. 3, the multilayered film consisting of the SiCN film 211 and the SiOC film 230 has a structure, in which the SiCN film 211 as the etch stopper film and the SiOC film 230 having lower film density than the SiCN film 211 are laminated. The SiOC film 230 contacts the SiCN film 211, and has a profile of the film density distribution, in which the film density gradually decreases as being further from the contacting surface with the SiCN film 211 that is defined as an origin. (i.e., decreases along the direction toward the upper laminating direction) In other words, the film density of the SiOC film 230 is relatively higher at the surface contacting with the SiCN film 211 and relatively lower in the upper portion in the laminating direction. Alternatively, the film density distribution of the SiOC film 230 may have other profile, which includes a portion having slightly increased film density as long as not providing a considerable influence to the whole film density of the SiOC film 230, in addition to the above-described profile of the present embodiment, in which the film density is flatly decreases. In this case, the SiOC film 230 composes a monolayer film containing no composition-discontinuing surface. Here, "containing no composition-discontinuing surface" means a condition, in which no interface is created within the SiOC film 230, and having such configuration, a stable adhesiveness is obtainable in the SiOC film 230. In addition, as a result of having such film density distribution profile, distributions of the elastic modulus and the hardness within the film also have profiles, in which they gradually decrease as being further from the contacting surface with the SiCN film 211 that is defined as an origin. In addition, the film stress distribution has a profile, in which the film stress gradually increases as being further from the contacting surface with the SiCN film 211 that is defined as an origin. In other words, the film stress is in a value of the compression mode that is closer to the film stress of the SiCN film 211 in vicinity of the above-described contact surface, and the distribution thereof is that the stress in the tensile mode increases as being further from the SiCN film 211.

Here, the elastic modulus is a Young's modulus, and the hardness is a Vickers hardness. In addition, the film stress means a value that is observed when a monolayer film is formed on the silicon substrate.

Since the semiconductor device 250 according to the present embodiment is provided with the multilayered film having the above-described configuration, the thermal stress generated at the interface between the SiCN film 211 and the SiOC film 230 is gradually relaxed, thereby considerably improving the adhesiveness therebetween. Having this configuration, thermal cycle resistance or the like is improved, and thus higher reliability of the semiconductor device 250 can be achieved.

Focusing on a profile of the dielectric constant distribution of the SiOC film 230, lower dielectric constant is provided in the center, and higher dielectric constant is provided in vicinity of the SiCN film 211. Therefore, the lower dielectric constant is presented for the whole SiOC film 230, and thus the interlayer insulating film having a combination of the improved interlayer adhesiveness and the lower dielectric constant can be achieved.

As described above, SiOC film 230 having such profile of the film density distribution in the film can be formed by, for example, changing the conditions of the deposition gas during the CVD process. More specifically, the flow rate of trimethylsilane (TMS) as a carbon source is set to be lower in vicinity of the SiCN film 211, and the flow rate thereof is set to be gradually increased, and the other conditions are appropriately set to provide the film having above-described configuration. Since trimethylsilane contains methyl group, trimethylsilane has more bulky molecular structure in comparison with monosilane or the like. Thus, the film density is decreased by increasing the amount of trimethylsilane in the reactant gas. Details of the manufacturing process will be described later.

Although the present embodiment is described in reference with the configuration, in which the film density of SiOC film 230 is continuously and flatly decreased as being further from the SiCN film 211, alternative configuration including a region having a constant film density may also be employed.

The point is that it is enough to present a film density distribution, which promotes a relaxation of the thermal stress between the SiOC film 230 and the SiCN film 211. When the configuration as described in the present embodiment, in which the film density is sequentially changed, is employed, stress in the film is more preferably dispersed, and considerable improvement in the adhesiveness can stably obtained.

Although the density transition region having the above-described film density distribution is provided over the entire SiOC film 230 in the present embodiment, the density transition region may be provided only in a portion of the SiOC film 230. In such case, desired profile of the film density distribution in the upper portion of the density transition region can arbitrarily be provided, and in view of reducing the dielectric constant, the film having a specific dielectric constant of, for example, equal to or less than 2.7, can be presented in the case of being composed of a porous film.

Such density transition region may be provided in the side of the $SiO_2$ film 212 of the SiOC film 230, in addition to the SiCN film 211 side of the SiOC film 230. In other words, the film density distribution, in which the film density progressively decreases as being further from the $SiO_2$ film 212, may be provided. Having this configuration, the adhesiveness thereof in the $SiO_2$ film 212 side is also improved, in addition to that of the side of the SiCN film 211.

Further, both of the density transition regions of the SiOC film 230 disposed either in the SiCN film 211 side and the $SiO_2$ film 212 side of the SiOC film 230 may have configurations, which are formed of multilayered films comprising films having different densities.

Having such configuration, stable adhesiveness in the SiOC film 230 is obtained by a simple process.

In addition, while the present embodiment is described in the configuration, in which only the SiOC film 230 has the density transition region, another configuration comprising a combination of the SiOC film 203 and the SiOC film 216 having the density transition regions may be employed. Having such configuration, the adhesiveness of the SiOC film 203 and the SiOC film 216 are improved, in addition to the adhesiveness of the SiOC film 230.

While the present embodiment is described by illustrating the case of employing the SiCN film for the first insulating film, other suitable films such as, for example, SiC film, SiN film, $SiO_2$ films and the like can be employed. In addition, while the present embodiment is described by illustrating the case of employing the SiOC film for the second insulating film, other suitable films containing suitable materials, such as: films coated with suitable materials containing carbon, such as, for example, methyl silsesquioxane (MSQ), methylated hydrosilsesquioxanes (MHSQ) and the like; CVD film such as silicon carbide (SiC) and the like consisting essentially of silicon and carbon; or porosified films thereof, may also be employed.

THIRD EMBODIMENT

In the present embodiment, an example illustrating a method of manufacturing a semiconductor device shown in the first embodiment will be described. Description will be made in reference with FIGS. 4A to 4D.

Figure 4A:
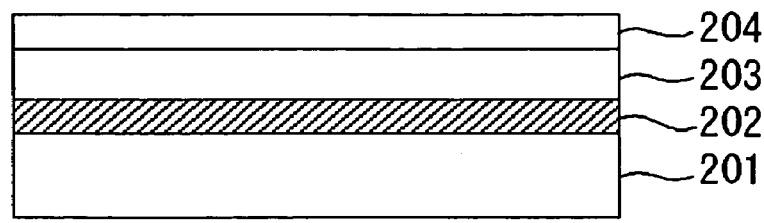
FIGS. 4A to 4D are cross-sectional views of a semiconductor device, showing processing steps for manufacturing a copper interconnect according to an embodiment.

First of all, a structure shown in FIG. 4A is produced. First, an underlying insulating film 201 is provided on a substrate (not shown in the drawings), which has a semiconductor device formed thereon, and a SiCN film 202 for functioning as an etch stopper film in a process for forming an interconnect trench is deposited thereon to a thickness of 50 nm via a plasma CVD process.

Then, the SiOC film 203 is deposited to a thickness of 300 nm via a plasma CVD process, in which a flow rate of trimethylsilane gas is stepwise increased. In this case, the film density of the deposited SiOC film 203 is gradually decreased by stepwise increasing the flow rate of trimethylsilane gas. Since trimethylsilane contains methyl group, trimethylsilane has more bulky molecular structure in comparison with monosilane or the like. Thus, the film density is decreased by increasing the amount of trimethylsilane in the reactant gas.

Figure 5:
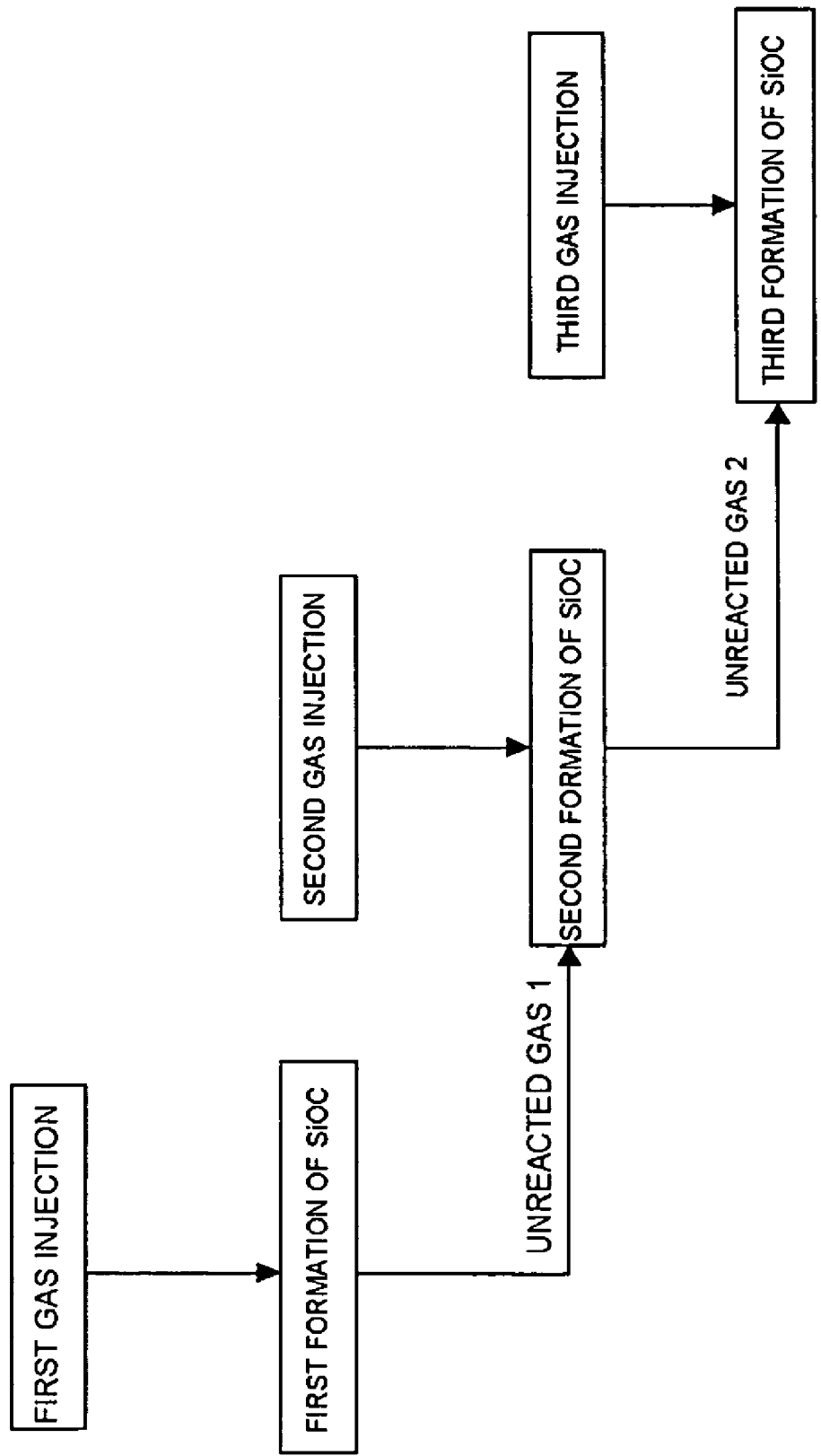
FIG. 5 is a block diagram, illustrating a process for manufacturing a copper interconnect according to an embodiment.

Here, as shown in the process block diagram of FIG. 5, the whole trimethylsilane gas introduced into the CVD reactor is not necessarily consumed for depositing films via the plasma CVD process, and the unreacted gas, which has not been consumed for depositing films via CVD process, also remains in the CVD reactor. Thus, a gaseous mixture of the unreacted gas remaining in the CVD reactor and trimethylsilane gas newly introduced into the CVD reactor will be consumed for the subsequent deposition.

Therefore, even if the flow rate of trimethylsilane gas is increased in the stepwise manner, carbon content in the gaseous mixture employed for the deposition of the SiOC film 203 is smoothly and continuously increased. As a result, the profiles of the film density, the elastic modulus and the thermal stress of the deposited SiOC film 203 are not presented by stepwise values but presented by smoothly and continuously varied values.

Thereafter, the $SiO_2$ film 204 is deposited to a thickness of 100 nm via a plasma CVD process to obtain the structure shown in FIG. 4A.

Figure 4B:
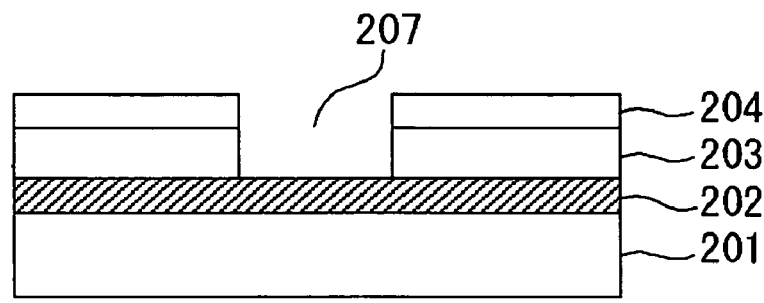

Thereafter, the $SiO_2$ film 204 and the SiOC film 203 are selectively dry etched through a resist mask that is not shown in the figure to form interconnect trenches 207 (FIG. 4B).

Figure 4C:
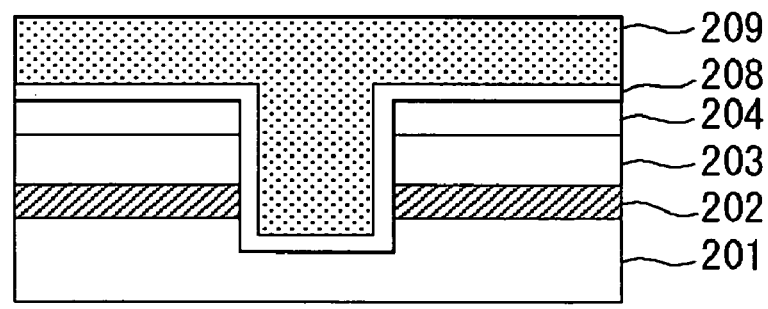

Then, etch back process is conducted in order to remove the SiCN film 202. Thereafter, a Ta/TaN film 208 (multilayered film comprising an upper layer of Ta and a lower layer of TaN, and so forth) as a barrier metal is deposited to a thickness of about 30 nm via a sputtering process, and then, a Cu film for functioning as a seed layer is deposited thereon via a sputtering process. Thereafter, a Cu film 209 is formed via an electrolytic plating so as to fill the interconnect trench 207 therewith (FIG. 4C). The Cu film 209 is annealed within a $N_2$ atmosphere at 400 degree C. for 30 minutes to be crystallized. Then, the Cu film 209 and the Ta/TaN film 208 on the $SiO_2$ film 204 are removed via CMP to remove copper disposed outside of the interconnect trench 207. CMP is continued until the surface of the $SiO_2$ film 204 is exposed. The copper interconnect is thus formed, and the semiconductor device 500, which is a part of the semiconductor device 200, is formed. (FIG. 4D)

Figure 4D:
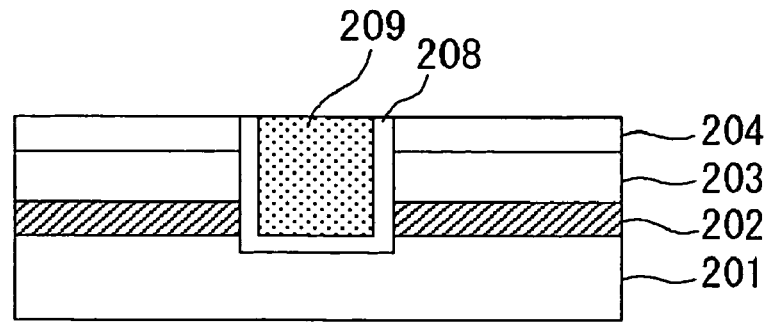

After forming the device shown in FIG. 4D, an interlayer insulating film is additionally formed, and similar processing is conducted to obtain a multilayered interconnect structure. In addition, while only the cross-sectional view of a single copper interconnect is illustrated in the figure, a plurality of interconnect may also be simultaneously provided in other regions.

The copper interconnect shown in FIG. 1 can be formed by conducting the above-mentioned process.

Therefore, the SiOC film 203 contacts the SiCN film 202, and has a profile of the film density distribution, in which the film density gradually decreases as being further from the contacting surface with the SiCN film 202 that is defined as an origin. (i.e., decreases along the direction toward the upper laminating direction) In other words, the film density of the SiOC film 203 is relatively higher at the surface contacting with the SiCN film 202 and relatively lower in the upper portion in the laminating direction. Alternatively, the film density distribution of the SiOC film 203 may have other profile, which includes a portion having slightly increased film density as long as not providing a considerable influence to the whole film density of the SiOC film 203, in addition to the above-described profile of the present embodiment, in which the film density is flatly decreases. In this case, the SiOC film 203 composes a monolayer film containing no composition-discontinuing surface. Here, "containing no composition-discontinuing surface" means a condition, in which no interface is created within the SiOC film 203, and having such configuration, a stable adhesiveness is obtainable in the SiOC film 203. In addition, as a result of having such film density distribution profile, distributions of the elastic modulus and the hardness within the film also have profiles, in which they gradually decrease as being further from the contacting surface with the SiCN film 202 that is defined as an origin. In addition, the film stress distribution has a profile, in which the film stress gradually increases as being further from the contacting surface with the SiCN film 202, which is defined as an origin. In other words, the film stress is in a value of the compression mode that is closer to the film stress of the SiCN film 202 in vicinity of the above-described contact surface, and the distribution thereof is that the stress in the tensile mode increases as being further from the SiCN film 202.

Here, the elastic modulus is a Young's modulus, and the hardness is a Vickers hardness. In addition, the film stress means a value that is observed when a monolayer film is formed on the silicon substrate.

Since the semiconductor device 200 according to the present embodiment is provided with the multilayered film having the above-described configuration, the thermal stress generated at the interface between the SiCN film 202 and the SiOC film 203 is gradually relaxed, thereby considerably improving the adhesiveness therebetween. Having this configuration, thermal cycle resistance or the like is improved, and thus higher reliability of the semiconductor device 200 can be achieved.

Focusing on a profile of the dielectric constant distribution of the SiOC film 203, lower dielectric constant is provided in the center, and higher dielectric constant is provided in vicinity of the SiCN film 202. Therefore, the lower dielectric constant is presented for the whole SiOC film 203, and thus the interlayer insulating film having a combination of the improved interlayer adhesiveness and the lower dielectric constant can be achieved.

While the present embodiment is described in reference with the configuration, in which the film density of SiOC film 203 is continuously and flatly decreased as being further from the SiCN film 202, alternative configuration including a region having a constant film density may also be employed. The point is that it is enough to present a film density distribution, which promotes a relaxation of the thermal stress between the SiOC film 203 and the SiCN film 202.

While the density transition region having the above-described film density distribution is provided over the entire SiOC film 203 in the present embodiment, the density transition region may be provided only in a portion of the SiOC film 203. In such case, desired profile of the film density distribution in the upper portion of the density transition region can arbitrarily be provided, and in view of reducing the dielectric constant, the film having a specific dielectric constant of, for example, equal to or less than 2.7, can be presented in the case of being composed of a porous film.

Such density transition region may be provided in the SiO$_2$ film 204 side of the SiOC film 203, in addition to the SiCN film 202 side of the SiOC film 203. In other words, the film density distribution, in which the film density progressively decreases as being further from the SiO$_2$ film 204, may be provided. Having this configuration, the adhesiveness thereof in the SiO$_2$ film 204 side is also improved, in addition to that of the side of the SiCN film 202.

In this case, the SiOC film 203 is deposited to a thickness of 300 nm via a plasma CVD process, in which a flow rate of trimethylsilane gas is first stepwise increased, and then the deposition is continued at a constant flow rate thereof, and thereafter the flow rate thereof is stepwise decreased. The film density of the SiOC film 203 is gradually decreased, and then is constant for a while, and thereafter the film density is gradually increased, by employing the process condition, in which a flow rate of trimethylsilane gas is first, stepwise increased, and then the deposition is continued at a constant flow rate thereof, and thereafter the flow rate thereof is stepwise decreased. Since trimethylsilane contains methyl group, trimethylsilane has more bulky molecular structure in comparison with monosilane or the like. Thus, the film density is decreased by increasing the amount of trimethylsilane in the reactant gas.

Further, both of the density transition regions in the SiOC film 203 disposed either in the SiCN film 202 side and the SiO$_2$ film 204 side of the SiOC film 203 may have configurations, which are formed of multilayered films comprising films having different densities. Having such configuration, stable adhesiveness in the SiOC film 203 is obtained by a simple process.

Although the present embodiment is described by illustrating the case of employing the SiCN film for the first insulating film, other suitable films such as, for example, SiC film, SiN film, SiO$_2$ films and the like can be employed. In addition, while the present embodiment is described by illustrating the case of employing the SiOC film for the second insulating film, other suitable films containing suitable materials, such as: films coated with suitable materials containing carbon, such as, for example, methyl silsesquioxane (MSQ), methylated hydrosilsesquioxanes (MHSQ) and the like; CVD film such as silicon carbide (SiC) and the like consisting essentially of silicon and carbon; or porosified films thereof, may also be employed.

EXAMPLES

Example 1

In this example, a SiOC film having a film density distribution, in which the film density is increased toward a lower surface thereof, was formed on a SiCN film by employing a plasma CVD process.

Figure 6:
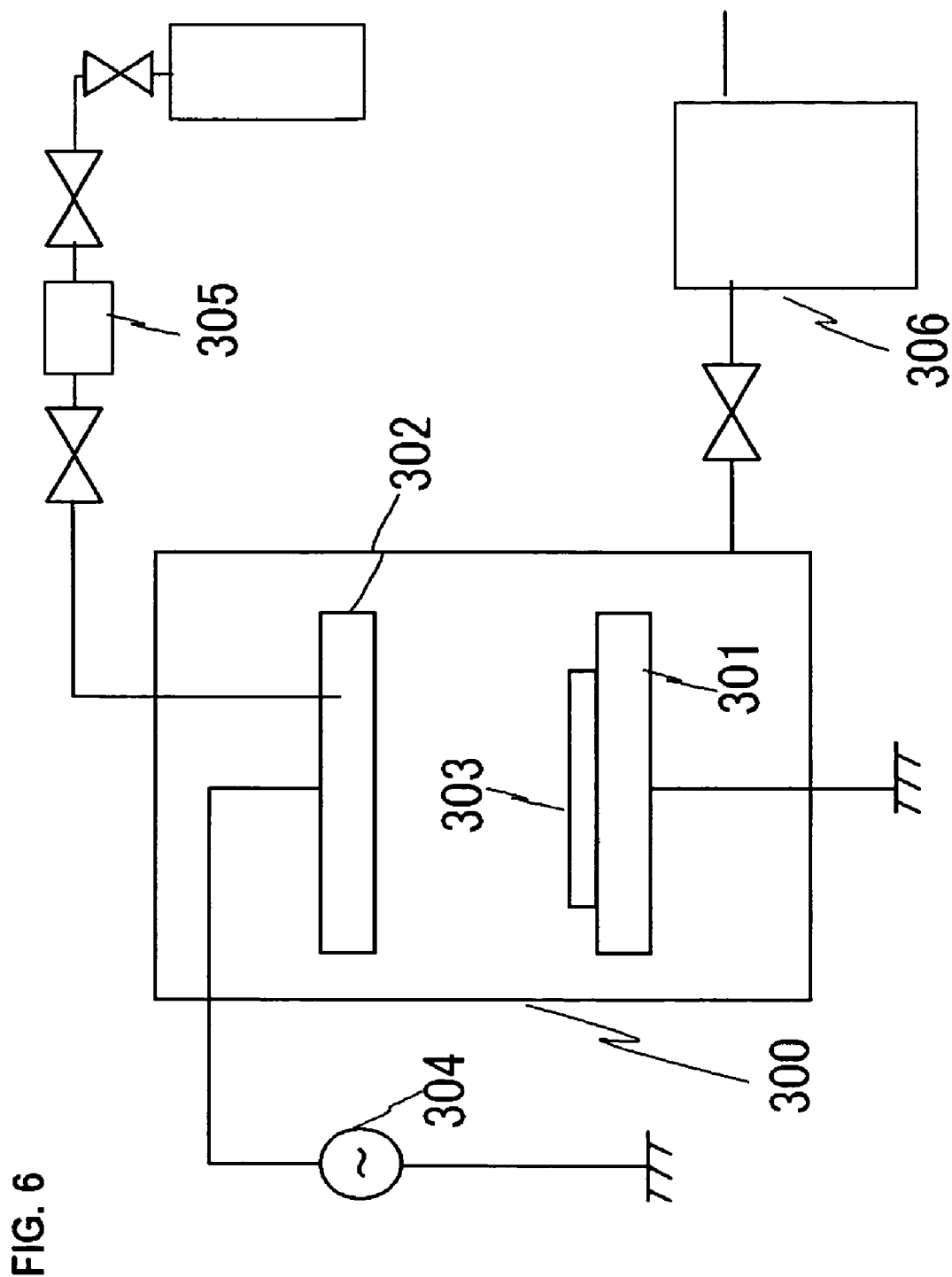
FIG. 6 is a schematic diagram of a CVD apparatus preferably employed in an embodiment.

FIG. 6 is a schematic diagram of a plasma CVD apparatus employed in this example, and comprises a deposition chamber 300, a heater 301, an upper electrode 302, a RF oscillator 304, a mass flow controller 305, and an exhaust pump 306, and a silicon substrate 303 is disposed on the heater 301. The deposition condition for the SiOC film is shown in FIGS. 7A and 7B. These conditions of: temperature: 350 degrees C.; pressure: 4 Torr; RF power: 600 W; O$_2$: 500 sccm; and He: 300 sccm were fixed, regardless of the type of the deposition steps, and inlet flow rate of trimethylsilane was changed. Alternatively, as shown in FIG. 7C, the deposition thereof may be carried out to exclude a deposition step with a constant flow rate of trimethylsilane.

Figures 8A, 8B, 8C:
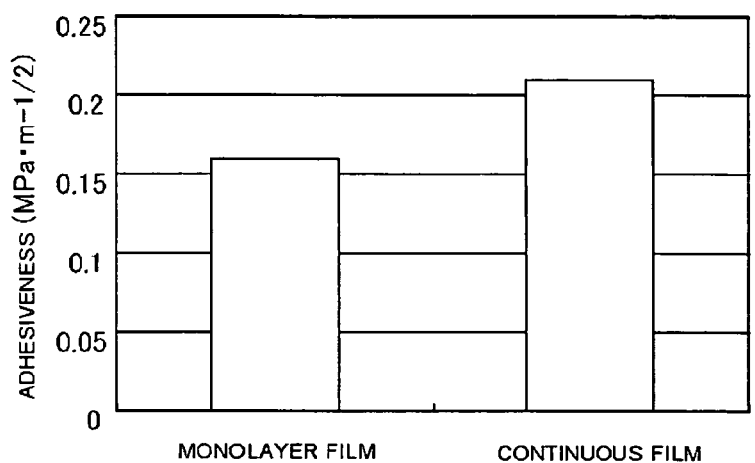
FIG. 8A is a table, describing properties of the obtained films.
FIG. 8B is a histogram showing the adhesiveness of the obtained films and FIG. 8C is a table describing production yields.

Physical properties of the SiOC film deposited via the above-described process is shown in FIG. 8A. According to FIG. 8A, it is understood that the film density and the elastic modulus thereof are decreased as increasing the flow rate of trimethylsilane gas.

The adhesiveness between the deposited SiOC film and the SiCN film were measured by using modified edge liftoff test (m-ELT). The m-ELT is a method, in which a test sample is coated with a epoxy resin, and the epoxy is then cooled to be shrunk, and the level of being peeled off of the shrunk epoxy is measured to provide an adhesiveness. The adhesiveness between the SiOC film and the SiCN film was measured using m-ELT, and it was observed that no peel off from the SiCN film was not observed, when the film density of the SiOC film is equal to or higher than 1.5 g/cm$^3$, as shown in FIG. 8A. Thus, it is preferable to form the SiOC layer having a film density of equal to or higher than 1.5 g/cm$^3$ as the lowest layer contacting the SiCN film, when the SiOC film is deposited on the SiCN film.

FIG. 8B is a histogram showing a difference in the adhesiveness of a continuous film, which is a SiOC film deposited via the above-described process, and the adhesiveness of a monolayer film, which is a SiOC film deposited at a constant flow rate of trimethylsilane gas, and it is apparent from the histogram that the continuous film exhibits higher adhesiveness than the monolayer film.

FIG. 8C is a table describing the results of production yield evaluations by the endurance test for each of the continuous film and the monolayer film. According to the table, it can be seen that the continuous film provides better adhesiveness than the monolayer film.

Here, the film density of the SiCN film is 1.5 g/cm$^3$. Therefore, it can be understood from the present example that the difference in the film density between the SiOC film and the SiCN film is preferably equal to or less than 0.7 g/cm$^3$, such that the adhesiveness thereof is stably improved.

On the other hand, the film density of the SiO$_2$ film is 2.2 g/cm$^3$. Therefore, it can be understood from the present example that the difference in the film density between the SiOC film and the SiO$_2$ film is preferably equal to or less than 0.7 g/cm$^3$, such that the adhesiveness thereof is stably improved.

In addition, depositions according to the above-described process provides such film density distribution profile, and thus, in turn, distributions of the elastic modulus and the hardness within the film also have profiles, in which they gradually decrease as being further from the contacting surface with the SiCN film 202 that is defined as an origin. In addition, the film stress distribution has a profile, in which the film stress gradually increases as being further from the contacting surface with the SiCN film 202 that is defined as an origin. In other words, the film stress is in a value of the compression mode that is closer to the film stress of the SiCN film 202 in vicinity of the above-described contact surface, and the distribution thereof is that the stress in the tensile mode increases as being further from the SiCN film 202.

Example 2

In this example, a SiOC film having a film density distribution, in which the film density is increased toward a lower surface and toward an upper surface thereof, was formed on a SiCN film by employing a plasma CVD process.

Figures 9A, 9B:
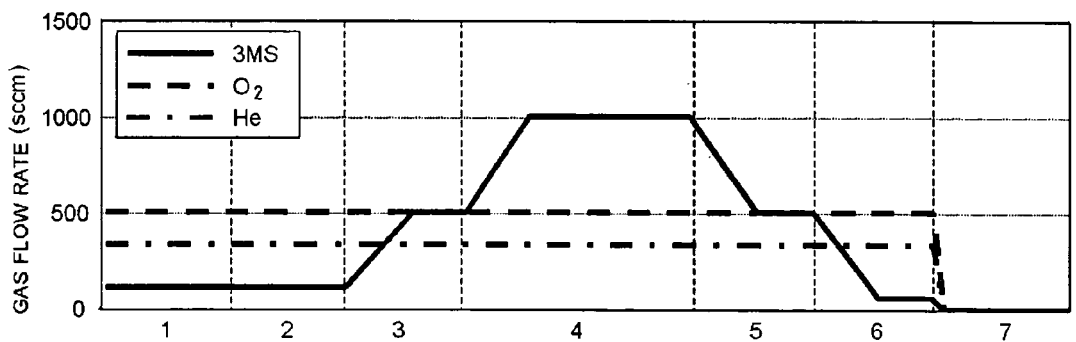
FIG. 9A is a table, describing conditions for the depositing process employed in embodiments.
FIG. 9B is a graph, showing a change in gas volumetric flow rates over time.

FIG. 6 is a schematic diagram of a plasma CVD apparatus employed in this example, and comprises a deposition chamber 300, a heater 301, an upper electrode 302, a RF oscillator 304, a mass flow controller 305, and an exhaust pump 306, and a silicon substrate 303 is disposed on the heater 301. The deposition condition for the SiOC film is shown in FIG. 9A. These conditions of: temperature: 350 degree C.; pressure: 4 Torr; RF power: 600 W; $O_2$: 500 sccm; and He: 300 sccm were fixed regardless of the type of the deposition steps, and inlet flow rate of trimethylsilane was changed.

Physical properties of the SiOC film deposited via the above-described process is as shown in FIG. 8A. It is understood that the film density and the elastic modulus thereof are decreased as increasing the flow rate of trimethylsilane gas, and the film density and the elastic modulus thereof are increased as decreasing the flow rate of trimethylsilane gas.

Example 3

In this example, a SiOC film having a film density distribution, in which the film density is increased toward a lower surface thereof, was formed on a SiCN film by employing a spin coating.

Figure 10:
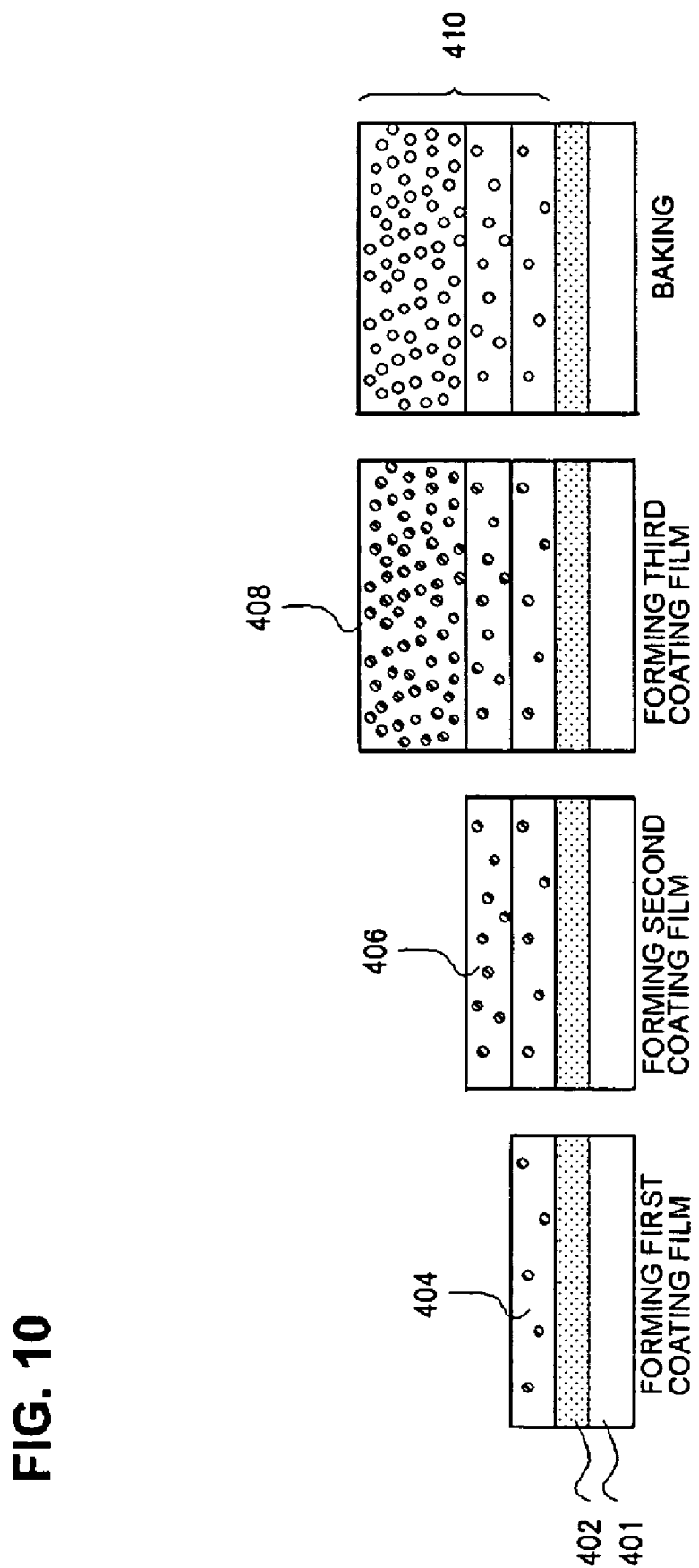
FIG. 10 illustrates cross-sectional views of the semiconductor device, showing deposition process steps in an embodiment.

As shown in FIG. 10, deposition of a SiOC film 410 was carried out as follows. A first SiOC having higher density is applied on a SiCN film 402 deposited on a $SiO_2$ film 401 via the spin-coating, and the applied SiOC is cured at a temperature of from 150 degree C. to 250 degree C. for around 5 minutes to volatilize the solvent contained therein, thereby forming a first SiOC film 404. Then, a second SiOC having a medium density is applied thereon via the spin-coating, and the applied SiOC is cured at a temperature of from 150 degree C. to 250 degree C. for around 5 minutes to volatilize the solvent contained therein, thereby forming a second SiOC film 406. In the next, a third SiOC having lower density is applied thereon via the spin-coating, and the applied SiOC is cured at a temperature of from 150 degree C. to 250 degree C. for around 5 minutes to volatilize the solvent thereof, thereby forming a third SiOC film 408. Then, additives are removed by baking thereof at a temperature of 400 degree C. for one hour to form a SiOC film 410 having different film densities.

The application liquid employed in the spin-coating in the present example was a mixture of the reactants for the SiOC film and the additives, and the additives are required to have a property to volatilize during the baking process at an elevated temperature, and organic compounds such as, for example, 1,2-dichloroethane, tetrahydrofuran, dioxane, toluene, acetone and the like are preferably employed.

As have been described in this example, the SiOC film formed via the spin coating process stably exhibits an improved adhesiveness at the interface thereof with the SiCN film 402.

In this example, the deposited SiOC film is the porous film having a film density distribution of the stepwise profile, and the level of the density of the SiOC is dependent upon the level of the porosity thereof, and more specifically, lower porosity provides higher film density.

Comparative Example

In this comparative example, a difference in an adhesiveness depending on a difference in a carbon concentration in the SiOC film and a difference in an adhesiveness depending on a difference in the film density of the SiOC film were compared.

Figure 11A:
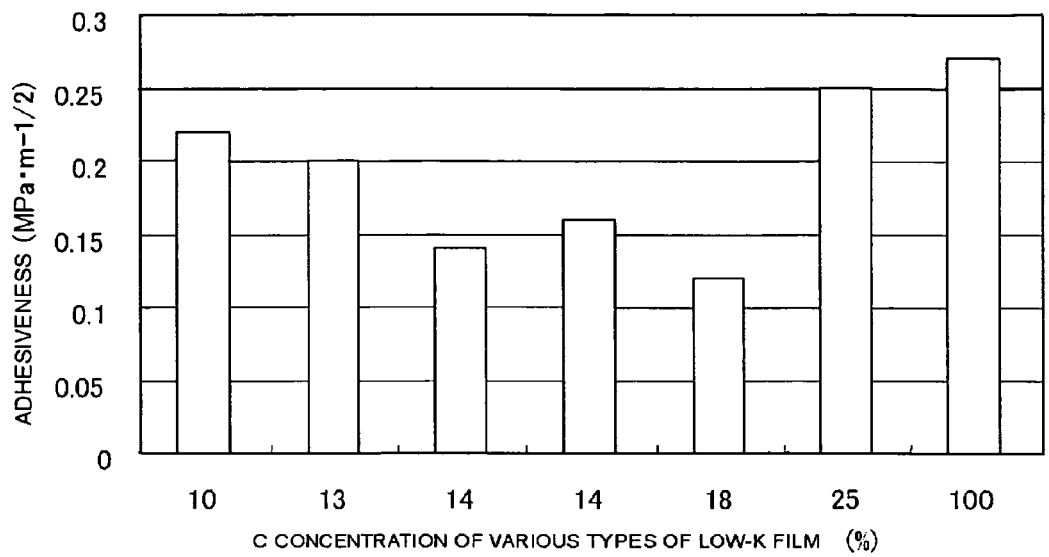
FIGS. 11A and 11B are histogram showing the adhesiveness of the obtained films.
Figure 11B:
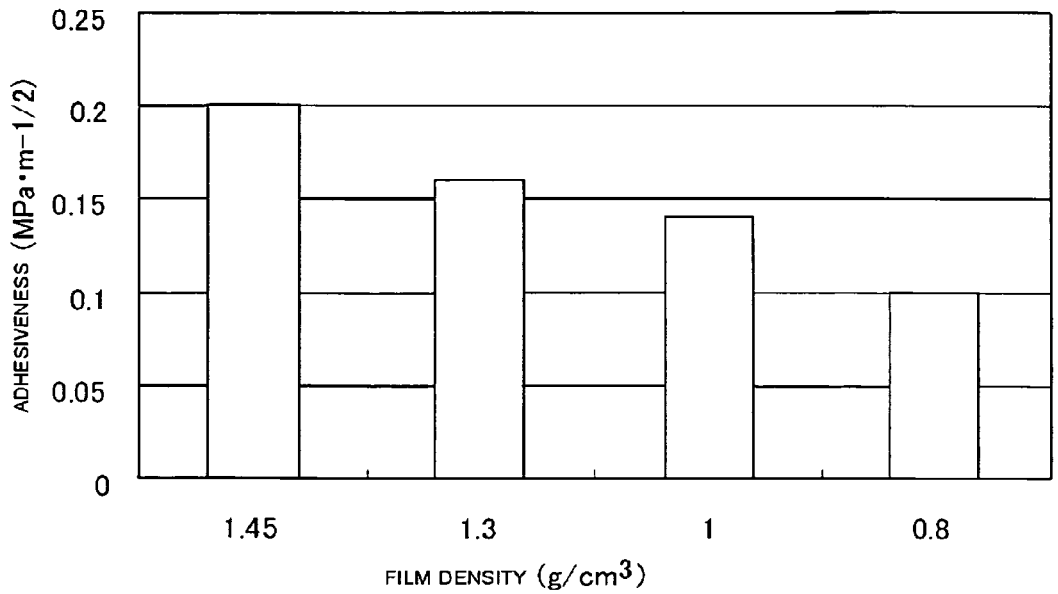

FIG. 11A is a histogram, showing a relationship of the carbon concentration in the SiOC film and the adhesive strength of the SiOC film, and FIG. 11B is a histogram, showing a relationship of the film density of the SiOC film having a carbon concentration of about 13 to 15 wt %. and the adhesive strength of the SiOC film. According to FIG. 11A, it is appeared that the adhesive strength of the SiOC film is independent on the carbon concentration in the SiOC film. In addition, according to FIG. 11B, it is appeared that the adhesive strength of the SiOC film is dependent on the film density of the SiOC film, provided that the carbon concentration in the SiOC film is about 13 to 15 wt %.

In this case, it is not always correlative between the carbon concentration in the SiOC film and the film density of the SiOC film. Therefore, the film density of the SiOC film cannot be adjusted to a desired film density by only adjusting the carbon concentration in the SiOC film. By adjusting other depositing conditions in addition to the carbon concentration, a desired film density of the SiOC film for providing a desired adhesive strength of the SiOC film can be obtained.

While the present invention has been described in reference with the preferred embodiments, it is apparent to those skilled in the art that the disclosures contained herein are for the purpose of illustrating the present invention only, and other configurations of the structures or processes may be suitably employed without departing from the scope and spirits of the invention.

For example, while the copper interconnect is employed in the above-described embodiment, a copper alloy interconnect may be employed in the present invention, the copper alloy interconnect including an alloy of copper with at least one of different elements of, such as: Al, Ag (silver), W (tungsten), Mg (magnesium), Be (beryllium), Zn (zinc), Pd (palladium), Cd (cadmium), Au (gold), Hg (mercury), Pt (platinum), Si (silicon), Zr (zirconium), Ti (titanium), Sn (tin), Ni (nickel), Nd (neodymium), Fe (iron) and so on.

In addition, while the above-described embodiment employs the Ta/TaN film as the barrier metal, the barrier metal may have a configuration of including at least one of Ti, TiN, TiSiN, Ta, TaN, and TaSiN.

In addition, while the above-described embodiment employs trimethylsilane gas and $O_2$ gas as reactant gases in the deposition for the insulating film via the plasma CVD process, gaseous mixture of an alkylsilane gas and an oxidizing gas maybe employed. Typical alkylsilane gas may include monomethyl silane, dimethylsilane, tetramethylsilane or the like, and these can be used alone or by combination of thereof. The oxidizing gas is a gas, which exhibits a function of oxidizing alkylsilanes, and thus gases containing oxygen element in their molecular may be employed. For example, one or more gas(es) selected from the group consisting of NO, $NO_2$, $N_2O$, CO, $CO_2$ and $O_2$ may be employed.

It is apparent that the present invention is not limited to the above embodiment and/or examples, which may be modified and changed without departing from the scope and spirit of the invention.

What is claimed is:

1. A semiconductor device, comprising:
   a semiconductor substrate; and
   an interlayer insulating film on said semiconductor substrate,
   wherein said interlayer insulating film includes a multilayered film having a first insulating film and a second insulating film directly contacting and having a lower film density than said first insulating film, and
   wherein said second insulating film includes a first density transition region, said first density transition region having a film density distribution profile in which porosity gradually increases as a distance from said first insulating film increases.

2. The semiconductor device according to claim 1, further comprising a third insulating film that is provided on the other side of the surface of said second insulating film opposite said first insulating film, said third insulating film having higher film density than said second insulating film, and wherein said second insulating film includes a second density transition region, said second density transition region having a film density distribution profile, in which the film density gradually decreases as a distance from said third insulating film increases.

3. The semiconductor device according to claim 2, wherein said third insulating film is selected from the group consisting of a SiC film, a SiCN film, a SiN film, and a $SiO_2$ film.

4. The semiconductor device according to claim 2, wherein said second density transition region is a monolayer film that does not have a composition discontinuing surface.

5. The semiconductor device according to claim 2, wherein said second density transition region comprises a multilayered film having different film densities.

6. The semiconductor device according to claim 1, wherein said first insulating film is selected from the group consisting of a SiC film, a SiCN film, a SiN film, and a $SiO_2$ film.

7. The semiconductor device according to claim 1, wherein said first density transition region is a monolayer film that does not have a composition discontinuing surface.

8. The semiconductor device according to claim 1, wherein said first density transition region comprises a multilayered film having different film densities.

9. The semiconductor device according to claim 1, wherein said second insulating film consists essentially of silicon and carbon.

10. The semiconductor device according to claim 9, wherein said second insulating film is a CVD-SiOC film.

11. The semiconductor device according to claim 1, wherein dielectric constant of said second insulating film is equal to or lower than 3.0.

12. The semiconductor device according to claim 1, wherein said second insulating film is a porous film.

13. The semiconductor device according to claim 1, wherein said second insulating film is a film containing methylsilsesquioxane (MSQ) or methylated hydrosilsesquioxanes (MHSQ).

* * * * *